US008355882B2

United States Patent
Nowicki et al.

(10) Patent No.: US 8,355,882 B2
(45) Date of Patent: Jan. 15, 2013

(54) METHOD FOR DETECTING HIGH IMPEDANCE FAULTS BY ANALYZING A LOCAL DEVIATION FROM A REGULARIZATION

(75) Inventors: Tomasz J. Nowicki, Fort Montgomery, NY (US); Grzegorz M. Swirszcz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 432 days.

(21) Appl. No.: 12/028,466

(22) Filed: Feb. 8, 2008

(65) Prior Publication Data
US 2009/0204347 A1 Aug. 13, 2009

(51) Int. Cl.
*G01R 31/00* (2006.01)
(52) U.S. Cl. ............. 702/58; 702/57; 702/117; 702/185
(58) Field of Classification Search ............... 702/58–60
See application file for complete search history.

(56) References Cited

U.S. PATENT DOCUMENTS

| | | | | |
|---|---|---|---|---|
| 5,402,071 A | * | 3/1995 | Bastard et al. | 324/509 |
| 6,453,248 B1 | * | 9/2002 | Hart et al. | 702/58 |
| 6,456,097 B1 | * | 9/2002 | Sutherland | 324/713 |
| 6,985,824 B2 | * | 1/2006 | Seki | 702/75 |
| 2003/0014200 A1 | * | 1/2003 | Jonker et al. | 702/60 |
| 2003/0014678 A1 | * | 1/2003 | Ozcetin et al. | 713/400 |
| 2005/0144537 A1 | * | 6/2005 | Cataltepe et al. | 714/47 |
| 2007/0035978 A1 | * | 2/2007 | Newman, Jr. | 363/148 |

OTHER PUBLICATIONS

Unknown, TI-83 Plus, http://faculty.uml.edu/mstick/Lins/TI_Systems_of_Eqs_and_Least_Squares_PDF.pdf, pp. 1-4.*
Rahman, M.A., Dash, P.K. and Downton, E.R., "Digital Protection of Power Transformer Based on Weighted Least Square Algorithm", Nov. 1982, IEEE Transactions on Power Apparatus and Systems, vol. PAS-101, No. 11, pp. 4204-4209.*
Moulin, Etienne, RMS Calculation for Energy Meter Applications Using the ADE7756, no date, Analog Devices, Application Note AN-578, Rev. A pp. 1-8.*

* cited by examiner

*Primary Examiner* — Jonathan C Teixeira Moffat
*Assistant Examiner* — Mischita Henson
(74) *Attorney, Agent, or Firm* — Stephen C. Kaufman; F. Chau & Associates, LLC

(57) ABSTRACT

A method for detecting high impedance faults, including: receiving an input waveform from a circuit; computing a root mean square of the input waveform; fitting a regression line to the root mean squares; computing a deviation between the regression line and the root mean squares; determining whether the deviations are above a threshold; and outputting a value indicating that a fault has occurred in the circuit when the deviation is above the threshold and outputting a value indicating that a fault did not occur in the circuit when the deviation is below the threshold.

18 Claims, 4 Drawing Sheets

Station 102, Current,
Phase B

Station 101, Current,
Phase B

Station 104, Current,
Phase B

Station 101, Voltage,
Neutral Phase

METHOD FOR DETECTING HIGH IMPEDANCE FAULTS BY ANALYZING A LOCAL DEVIATION FROM A REGULARIZATION

BACKGROUND OF THE INVENTION

1. Technical Field

The present invention relates to detecting high impedance faults (HIFs), and more particularly, to detecting HIFs by analyzing a local deviation from a regularization.

2. Discussion of the Related Art

In the electrical power generation and distribution industry, monitoring transmission and distribution networks for fault conditions is very important. The term distribution network is used herein to refer to any electrical power transmission or distribution facility. Moreover, a fault condition is any abnormal (unexpected) current-conducting path in a distribution network. Fault conditions often present danger to people and property. They also waste electrical energy.

One type of fault is a bolted (short circuit) fault of one or more legs of a distribution network to another leg thereof or ground. This type of low-impedance (low-Z) fault condition is easily detected by conventional circuit overcurrent protective devices such as fuses or circuit breakers. In other words, a complete short circuit (a low-impedance path) usually trips a circuit breaker or blows a fuse. A circuit of the distribution network experiencing such a fault condition is quickly removed from service until such time as repairs can be effected (i.e., until the fault is cleared).

Another type of fault condition occurs when an unintended high impedance (high-Z) conductive path occurs between transmission line legs or between one leg and ground. Such high-Z paths may occur when a tree limb or the like falls across a transmission line or when a single leg of the transmission line breaks (due to ice or wind, for example). Generally, a single conductor of the distribution network dropping to the ground will not create a short circuit, but will continue to allow current flow at a relatively low rate. Such current flow often causes arcing. This condition presents a great danger of electrocution to people or animals happening across the downed conductor. This arcing can also result in fire.

A problem in the electrical industry is finding an effective way to differentiate between a high-Z fault (HIF) condition and similar effects caused by changes in the loads attached to the distribution network. In addition to load switching events, power factor correcting capacitor banks are frequently switched on and off the network and transformer taps are automatically changed to keep the network performance constant. Both of these events also create conditions on the network which may appear similar to a HIF condition.

An effective system for detecting HIFs should be able to distinguish fault conditions from normal load switching events. A system which ignores legitimate HIF conditions risks the aforementioned dangers while a system which falsely trips in response to normal load switching events can wreak havoc with consumers relying on uninterrupted electrical service. Interruption of electrical service to certain manufacturing processes, for example, may destroy work-in-process and result in large expense to the manufacturer. An interruption of medical apparatus can be inconvenient at best, and disastrous at worst.

Accordingly, there exists a need for a technique of distinguishing HIF conditions from normal load, capacitor bank or transformer tap conditions with high accuracy.

SUMMARY OF THE INVENTION

In an exemplary embodiment of the present invention, a method for detecting high impedance faults, comprises: receiving an input waveform from a circuit; computing a root mean square of the input waveform for each of a plurality of consecutive first time periods; fitting a regression line to the root mean squares; computing a deviation between the regression line and the root mean squares for each of a plurality of consecutive second time periods; determining whether the deviations are above a threshold; and outputting a value indicating that a fault has occurred in the circuit when the deviation is above the threshold and outputting a value indicating that a fault did not occur in the circuit when the deviation is below the threshold.

The input waveform is represented by a one-dimensional table of numbers that includes a time at which the input waveform was first sampled, a sampling rate of the input waveform and a total time over which the samples were taken.

The root mean squares are computed by: selecting a first sliding window having a length equivalent to each of the first time periods; and moving the sliding window to a next first time period each time the root mean square for a present first time period is computed.

The regression line is fit to the root mean squares by: selecting a second sliding window having a length equivalent to each of the first time periods; and for each position of the second sliding window, fitting a linear model to the root mean squares in the second sliding window and computing a value of the linear model at a midpoint of the second sliding window.

The deviation is computed by: for each position of the second sliding window, subtracting the value of the linear model from the root mean squares in the second sliding window; selecting a third sliding window having a length equivalent to each of the second time periods; selecting a step interval that is smaller than the third sliding window; for each position of the third sliding window: computing a mean value of the difference between the value of the linear model and the root mean squares; and computing a maximum of the mean value subtracted from the difference; selecting the threshold; and for each step interval, determining whether the maximum of the mean value subtracted from the difference is greater than the threshold or less than the threshold.

The values indicating that a fault has occurred or did not occur are output in binary to a one-dimensional table.

The binary values indicate that a fault has or has not occurred during the step interval.

In an exemplary embodiment of the present invention, a system for detecting high impedance faults, comprises: a memory device for storing a program; a processor in communication with the memory device, the processor operative with the program to: receive an input waveform from a circuit; compute a root mean square of the input waveform for each of a plurality of consecutive first time periods; fit a regression line to the root mean squares; compute a deviation between the regression line and the root mean squares for each of a plurality of consecutive second time periods; determine whether the deviations are above a threshold; and output a value indicating that a fault has occurred in the circuit when the deviation is above the threshold and outputting a value indicating that a fault did not occur in the circuit when the deviation is below the threshold.

The circuit is a power distribution network.

The processor is further operative with the program when computing the root mean squares to: select a first sliding window having a length equivalent to each of the first time periods; and move the sliding window to a next first time period each time the root mean square for a present first time period is computed.

The processor is further operative with the program when fitting the regression line to the root mean squares to: select a second sliding window having a length equivalent to each of the first time periods; and for each position of the second sliding window, fit a linear model to the root mean squares in the second sliding window and compute a value of the linear model at a midpoint of the second sliding window.

The processor is further operative with the program when computing the deviation to: for each position of the second sliding window, subtract the value of the linear model from the root mean squares in the second sliding window; select a third sliding window having a length equivalent to each of the second time periods; select a step interval that is smaller than the third sliding window; for each position of the third sliding window: compute a mean value of the difference between the value of the linear model and the root mean squares; and compute a maximum of the mean value subtracted from the difference; selecting the threshold; and for each step interval, determine whether the maximum of the mean value subtracted from the difference is greater than the threshold or less than the threshold.

The values indicating that a fault has occurred or did not occur are output to a display device.

In an exemplary embodiment of the present invention, a method for detecting high impedance faults, comprises: receiving an input waveform from a circuit; computing an average of voltage and current over a plurality of first time periods for the input waveform; fitting a model to the averages; computing a deviation between the model and the averages over a plurality of second time periods; determining whether the deviations are above a threshold; and outputting results of the determination to a table.

The method further comprises triggering an alarm when the results indicate that a fault has occurred in the circuit.

The method further comprises: plotting a receiver operating characteristic (ROC) curve of the results; repeating the determining step using a different threshold; plotting an ROC curve of the results obtained with the different threshold; and determining an optimal threshold based on the ROC curves.

In an exemplary embodiment of the present invention, a method for detecting faults, comprises: receiving an electrical signal from a circuit; preprocessing the electrical signal to create a reference sampled over time; mapping the reference to a model; and determining whether a fault exists in the electrical circuit by analyzing a deviation between the reference and the model.

The electrical signal is at least one of a periodic and non-periodic signal.

The reference is sampled over at least one of two consecutive time periods and two non-consecutive time periods.

The fault is at least one of a high impedance fault and low impedance fault.

The foregoing features are of representative embodiments and are presented to assist in understanding the invention. It should be understood that they are not intended to be considered limitations on the invention as defined by the claims, or limitations on equivalents to the claims. Therefore, this summary of features should not be considered dispositive in determining equivalents. Additional features of the invention will become apparent in the following description, from the drawings and from the claims.

DETAILED DESCRIPTION OF EXEMPLARY EMBODIMENTS

A method for detecting high impedance faults (HIFs) by analyzing a local deviation from a regularization according to an exemplary embodiment of the present invention will now be described.

Figure 1:
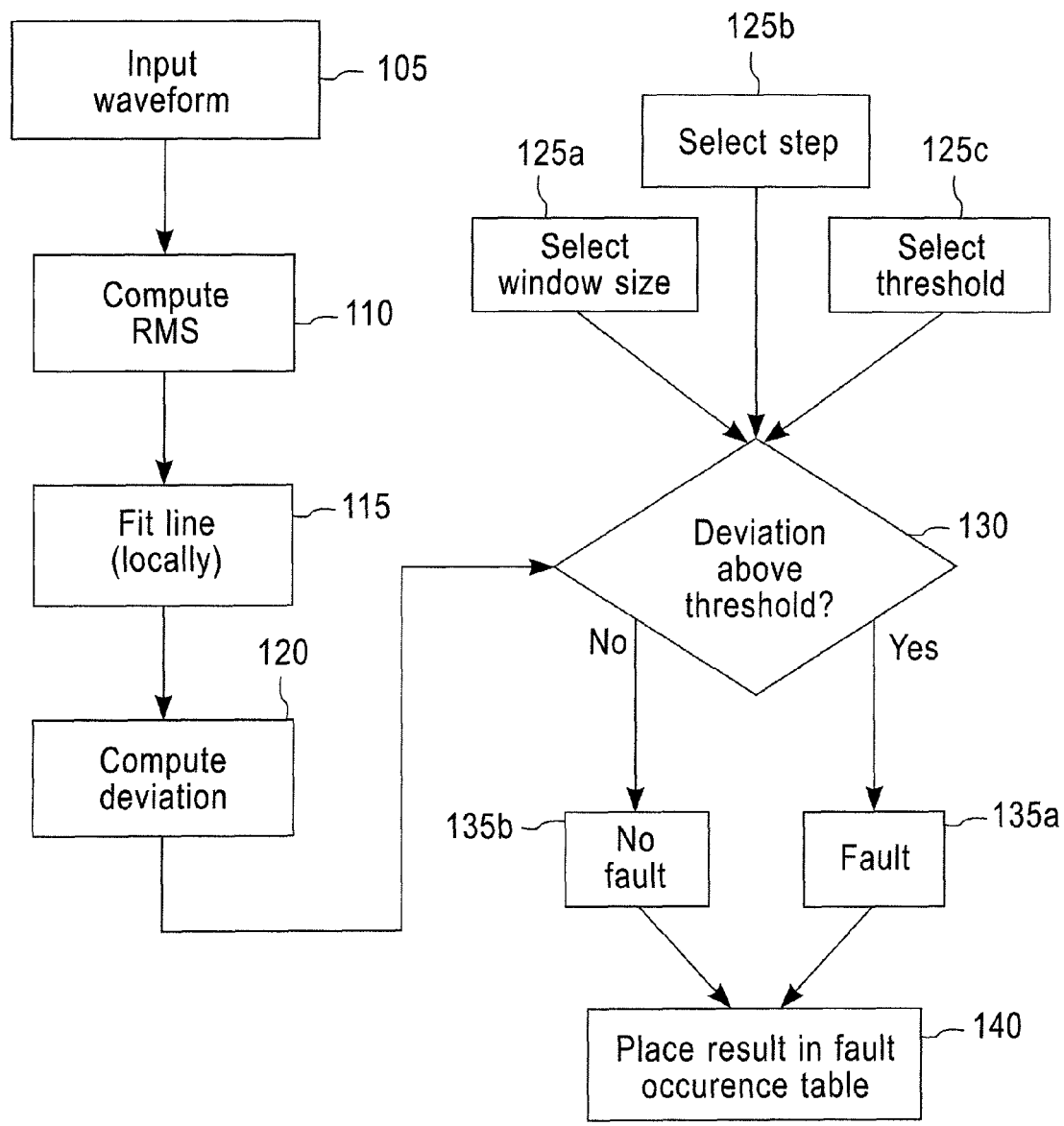
FIG. 1 is a flowchart illustrating a method for detecting high impedance faults (HIFs) by analyzing a local deviation from a regularization according to an exemplary embodiment of the present invention.

In FIG. 1, an input waveform is received from a power distribution network (105). The power distribution network may be any alternating current electrical transmission or distribution system or facility. The input waveform is measured (recorded) and is represented by a 1-dimensional table of numbers IW(s), indexed by s=0, 1, 2 . . . N−1, where N is the length of the table. The parameters describing this table include the time signature of the start of the measurement, a sampling rate r (indicating how often the samples were taken) and implicitly the total time (N/r) over which the samples were taken. An exemplary sampling rate may be 256 samples per cycle at 60 cycles per second.

Upon receipt of the input waveform, a table RMS(t) of root mean square (RMS) values indexed by t is computed (110).

The table RMS(t) is represented mathematically as:

$$RMS(t) = \frac{1}{W} \sqrt{\sum_{s=0}^{W-1} IW(t*\Delta T + s)^2},$$

with W representing the length of a sliding window (in many samples) over which RMS was computed, $\Delta T$ representing the amount in seconds the sliding window is moved each time a normalized RMS value is computed and s representing a running index of the samples within the sliding window. The number RMS(t) represents the RMS value of the input waveform at time $t*\Delta T$.

The value of W is a parameter that can be used to tune the algorithm. For example, in the case of a quasi-period input waveform, such as an alternating current (AC), the length W of the sliding window can be chosen as a multiple of the number of samples in a single cycle. Thus, using the cycle mentioned above, the multiple of 1/60 of a second worth of samples, i.e., 256, is used. The multiple could be larger than 1/60 of a second or it could be smaller than 1/60 of a second. However, choosing a W that is smaller than half the cycle length, i.e., smaller than 128, creates artificial periodic anomalies. It is also noted that the sliding window is generally moved by W=$\Delta T*r$; however, these parameters do not have to be equal. In addition, choosing a length W of the sliding window larger than ΔT*r creates a smoothing effect.

With the table RMS(t) of RMS values indexed by time computed (factoring in the value of ΔT), a regression line is fit thereto (115). For this, another sliding window of length D is used. This window is moved using a step size 1, which corresponds to an increment of time equivalent to ΔT. For each position of the sliding window a linear model is fit to the RMS data in the interval [t−D/2, t+D/2], and then a value f(t) of the linear model at the midpoint of the interval is computed. It is noted that the linear model can be replaced by a different model, such as polynomial, polynomial spline or trigonometric.

A deviation between the locally fit line and the RMS values is computed (120). The deviation is represented mathematically as: AIF(t)=RMS(t)−f(t). The value AIF(t) is a difference between the linear model f(t) and the RMS value RMS(t) both computed at the midpoint of the sliding window D. The deviation can then be used as a fault indicator. Prior to doing this, several parameters are chosen. It is noted that the following parameters can be chosen in any order.

The first parameters to be chosen are a length Q of a new sliding window (125a) and a step S (125b) smaller than Q. The window length Q may correspond to about 30 minutes of data, and the step S may correspond to about 10 minutes of data, for example. A mean value m of AIF(t) over this window is computed. From this, a maximum M of |AIF(t)−m| over the window is computed.

Given the window and the step we can establish fault indicators for all the indices t in the interval of length S in the center of the window Q, for this we chose a threshold T (125c). The threshold T is generally a value that lies between 0 and 1 (i.e., 0<T<1).

Now that the parameters have been chosen, it is determined whether the deviation is above the threshold T (130). For each t within the center interval of length S (within the window Q) for which |AIF(t)−m| exceeds T*M, a "fault" is reported (135a) and for each t for which |AIF(t)−m| exceeds T*M, a "no fault" is reported (135b). It is noted that when a "fault" is reported, the algorithm is indicating that a "fault occurred", not that "the line is in a fault state".

To establish the fault indicators for next values of the index t, we slide the window Q by the step S, recalculate the values m and M, and then, compare the deviations |AIF(t)−m| to T*M in the new center interval of length S. It is noted that these center intervals do not overlap or leave gaps.

The results of this determination are then placed in a fault occurrence table (140). The fault occurrence table is represented by a one-dimensional table of binary values FOT(t), t=1, 2 . . . M. The binary value 1 indicates "fault occurred" and the binary value 0 indicates "no fault occurred" in the network for the state of the input waveform at the index t, which represents the time t*ΔT.

The fault occurrence table can then be used to trigger alarms at moments t when FOT(t), or when some other function, such as a high running average, shows a high binary value.

Fault occurrence tables that are calculated using different threshold values can also be used with the aid of receiver operating characteristic (ROC) curves, to determine the best threshold level, which can be used to optimize the sensitivity of detection while keeping the frequency of false alarms low.

A system for detecting HIFs by analyzing a local deviation from a regularization according to an exemplary embodiment of the present invention will now be described.

Figure 2:
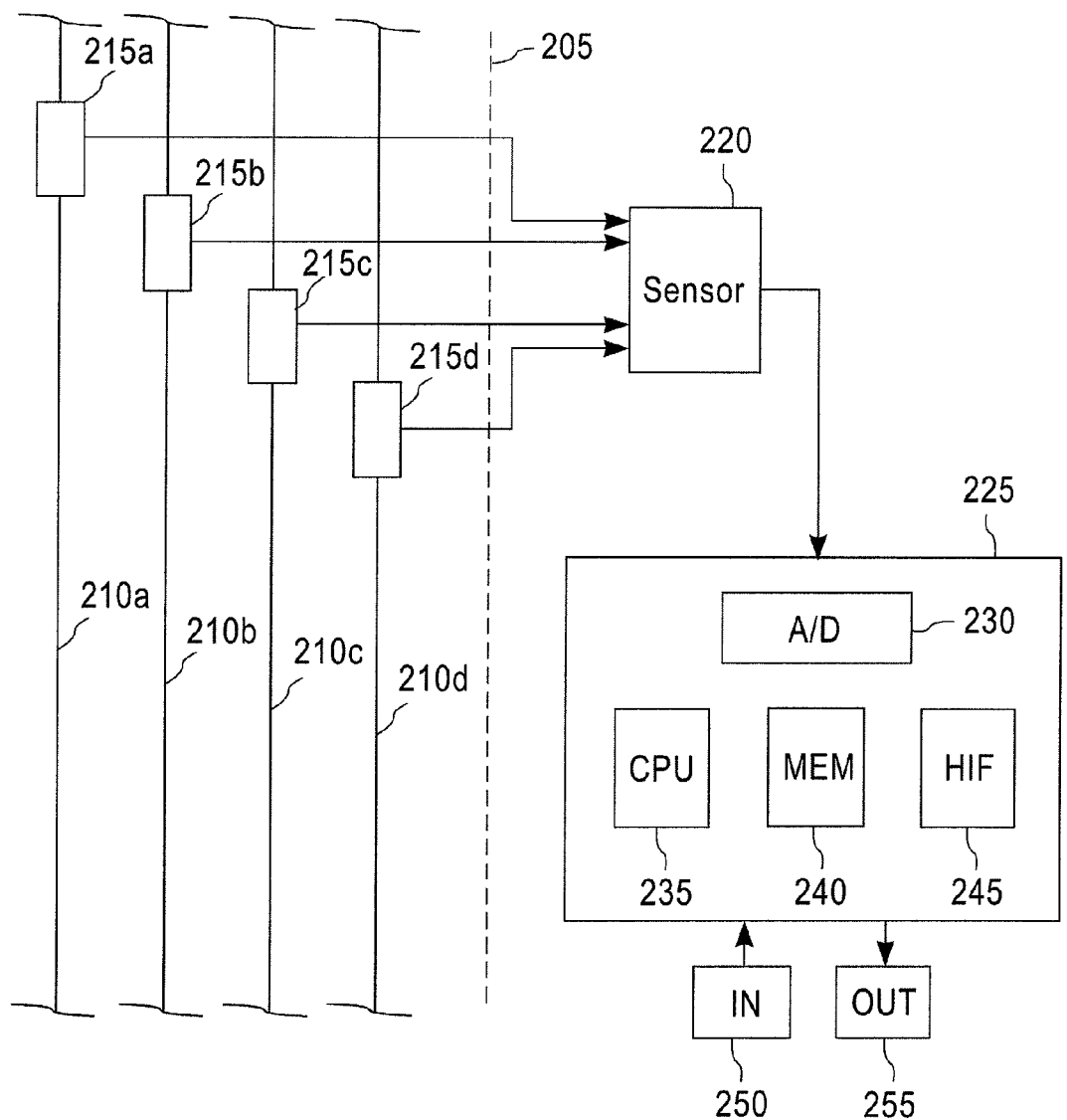
FIG. 2 is a block diagram illustrating a system for detecting HIFs by analyzing a local deviation from a regularization according to an exemplary embodiment of the present invention.

In FIG. 2, a portion of a typical three-phase power distribution network is shown by reference numeral 205. Phase conductors 210a-d of distribution network 205 are each monitored by current transformers 215a-d. Connected to the current transformers 215a-d is a sensor 220 that collects analog signals representing phase currents of the phase conductors 210a-d provided from the current transformers 215a-d. The sensor 220 may be a Lindsey multicore sensor available http://www.lindsey-usa.com/CVMI.php. The sensor 220 may be mounted to a pole on which the current transformers 215a-d are located. The sensor 220 may represent one or a multiple of sensors.

The sensor 220 provides the collected data to a computer 225, for example. The computer 225 may be a laptop that is used by a field technician, a computer found in an electrical substation or a central computer found at a power companies' headquarters. Data may be transmitted from the sensor 220 to the computer 225 either by direct connection or by using Broadband over power lines, for example.

The computer 225 may include an analog-to-digital (A/D) converter 230 if A/D conversion has not already been performed by the sensor 220. The computer 225 also includes a central processing unit (CPU) 235, a memory 240 and a HIF detection module 245 that includes program code for executing methods in accordance with an exemplary embodiment of the present invention. The computer 225 is also coupled to input and output devices 250 and 255.

The memory 240 includes random access memory (RAM) and read only memory (ROM). The memory 240 can also include a database, disk drive, tape drive or a combination thereof. The input 250 is constituted by a keyboard or mouse and the output 255 is constituted by a display or printer.

Figure 3:
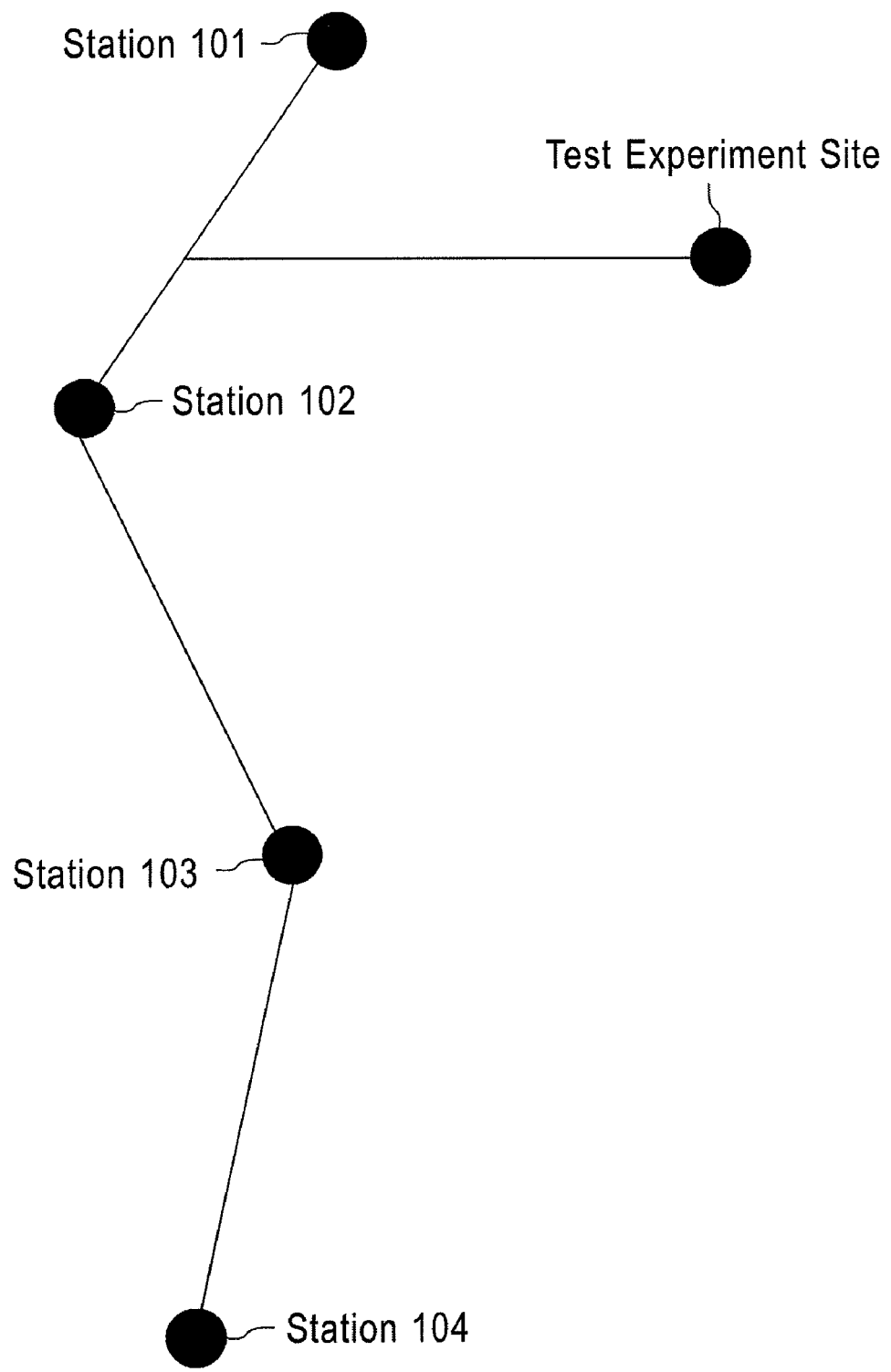
FIG. 3 is a schematic representation of a setup for an experiment that was conducted to test a method for detecting HIFs by analyzing a local deviation from a regularization according to an exemplary embodiment of the present invention.

FIG. 3 is a schematic representation of the setup for an experiment that was conducted to test a method for detecting HIFs by analyzing a local deviation from a regularization according to an exemplary embodiment of the present invention.

In FIG. 3, the line between stations 101-104 is a feeder, e.g., a medium voltage (13 kV) transmission line, that provides power from a substation (located near station 104) to customers. The customers are connected to the feeder by transformers, which reduce the voltage to 120V, that sit on laterals. The segment to the right of the feeder (test experiment site) is such a lateral; however, it is isolated from the customers and does not have transformers. Sensors were situated on each of the stations 101-104 and they collected data from each of the four transmission lines of the feeder.

Figure 4:
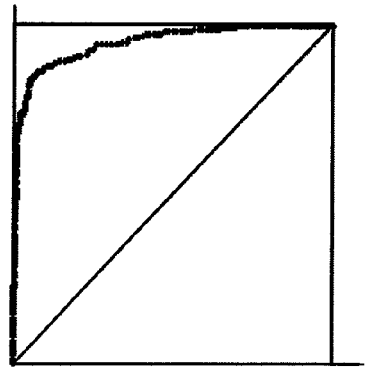
FIG. 4 includes four receiver operating characteristic (ROC) curves illustrating results of the experiment shown in FIG. 3.
Figure 4:
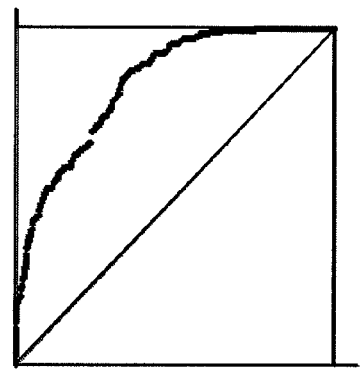
Figure 4:
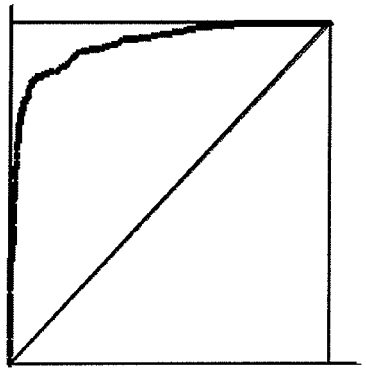
Figure 4:
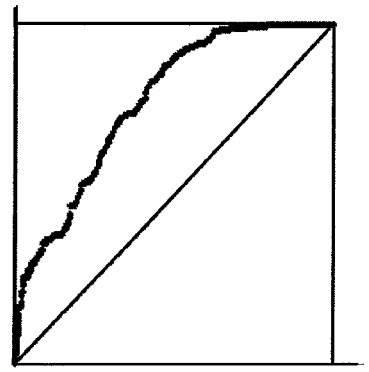

FIG. 4 shows results of the experiment represented as ROC curves.

In FIG. 4, data streams, such as a current on phase B (wire B) at station 102, a current on phase B (wire B) at station 101, a current on phase B (wire B) at station 104 and a voltage on the neutral phase at station 101, were measured. A different threshold was applied to each of the measurements. For the given thresholds, points were plotted on each of the graphs, with the proportion of false positives to all false detections marked on the horizontal axes and the proportion of true positives to all true detections marked on the vertical axes. In general, an ROC curve is monotone, i.e., it joins the point (0,0) for a threshold of 0 and the point (1,1) for a threshold of 1. Thus, for better detection methods, the curve should lie closer to the upper left hand corner (like that shown by the ROC curves for station 102, phase B and station 104, phase B), and for worse detection methods, the curve lies closer to the diagonal (like that shown for the ROC curve of station 101, voltage, neutral phase). It is noted that a detection method that produces points below the diagonal is worthless, since it provides proportionally more false positives than true detections.

By using the present invention, bursts in an input signal, which appear in a short time range, can be detected. Such bursts can be alternately detected by analyzing amplitudes of higher frequencies in Fourier or wavelet transforms of the signal. However, as opposed to these methods, the invention is better tuned to detect isolated or highly non-periodic bursts, which often appear at HIFs. For example, as discussed above, the burst of the signal is separated from the typical background behavior by averaging the first signal (to get rid of basic frequencies), then subtracting a locally found trend line from the signal (to get rid of the changes slow in time) and finally using thresholding to produce a YES/NO decision signal. This is particularly advantageous, since anomalies of the signal that occur within a short time range can be detected with high precision, from either an on-site location or a central command station.

It is noted that although the present invention has been discussed with particular reference to detecting HIFs on power lines, the invention is not limited thereto. For example, the present invention may also be used to detect a fault in a signal emanating from a telephone line or a control system. In addition, the electrical signal may be a non-periodic signal, such as a direct current (DC) signal used on a high-voltage DC transmission line.

It is understood that the present invention may be implemented in various forms of hardware, software, firmware, special purpose processors, or a combination thereof. In one embodiment, the present invention may be implemented in software as an application program tangibly embodied on a program storage device (e.g., magnetic floppy disk, RAM, CD ROM, DVD, ROM, and flash memory). The application program may be uploaded to, and executed by, a machine comprising any suitable architecture.

It is also understood that because some of the constituent system components and method steps depicted in the accompanying figures may be implemented in software, the actual connections between the system components (or the process steps) may differ depending on the manner in which the present invention is programmed. Given the teachings of the present invention provided herein, one of ordinary skill in the art will be able to contemplate these and similar implementations or configurations of the present invention.

It is further understood that the above description is only representative of illustrative embodiments. For the convenience of the reader, the above description has focused on a representative sample of possible embodiments, a sample that is illustrative of the principles of the invention. The description has not attempted to exhaustively enumerate all possible variations. That alternative embodiments may not have been presented for a specific portion of the invention, or that further undescribed alternatives may be available for a portion, is not to be considered a disclaimer of those alternate embodiments. Other applications and embodiments can be implemented without departing from the spirit and scope of the present invention.

It is therefore intended, that the invention not be limited to the specifically described embodiments, because numerous permutations and combinations of the above and implementations involving non-inventive substitutions for the above can be created, but the invention is to be defined in accordance with the claims that follow. It can be appreciated that many of those undescribed embodiments are within the literal scope of the following claims, and that others are equivalent.

What is claimed is:

1. A method for detecting high impedance faults, comprising:
    receiving, using a device, an input waveform from a circuit, wherein the circuit is a power distribution network;
    computing, using the device, a root mean square of the input waveform for each of a plurality of consecutive first time periods;
    fitting, using the device, a regression line to the root mean squares;
    computing, using the device, a deviation between the regression line and the root mean squares for each of a plurality of consecutive second time periods;
    determining, using the device, whether the deviations are above a threshold, wherein determining whether the deviations are above the threshold comprises selecting a continuous number of the second time periods for analysis, computing a mean of the deviations within the selected time period and computing a maximum of the deviations within the selected time period minus the mean, wherein the deviations are above the threshold when the mean exceeds a predetermined percentage of the maximum; and
    outputting, using the device, a first value indicating that a high impedance fault has occurred in the circuit when the deviation is above the threshold and a second value indicating that a high impedance fault did not occur in the circuit when the deviation is below the threshold,
    wherein the input waveform is generated without being triggered by the device, and
    wherein machine code is executed by a processor of the device to compute the deviation between the regression line and the root mean squares for each of the plurality of consecutive second time periods.

2. The method of claim 1, wherein the input waveform is represented by a one-dimensional table of numbers that includes a time at which the input waveform, was first sampled, a sampling rate of the input waveform and a total time over which the samples were taken.

3. The method of claim 1, wherein the root mean squares are computed by:
    selecting a first sliding window having a length equivalent to each of the first time periods; and
    moving the sliding window to a next first time period each time the root mean square for a present first time period is computed.

4. The method of claim 3, wherein the regression line is fit to the root mean squares by:
    selecting a second sliding window having a length equivalent to each of the first time periods; and
    for each position of the second sliding window, fitting a linear model to the root mean squares in the second sliding window and computing a value of the linear model at a midpoint of the second sliding window.

5. The method of claim 4, wherein the deviation is computed by:
    for each position of the second sliding window, subtracting the value of the linear model from the root mean squares in the second sliding window;
    selecting a third sliding window having a length equivalent to each of the second time periods;
    selecting a step interval that is smaller than the third sliding window;
    for each position of the third sliding window:
    computing a mean value of the difference between the value of the linear model and the root mean squares; and computing a maximum of the mean value subtracted from the difference;

selecting the threshold; and for each step interval, determining whether the maximum of the mean value subtracted from the difference is greater than the threshold or less than the threshold, wherein the third sliding window and step interval are freely selectable parameters.

6. The method of claim 5, wherein the values indicating that a high impedance fault has occurred or did not occur are output in binary to a one-dimensional table.

7. The method of claim 6, wherein the binary values indicate that a high impedance fault has or has not occurred during the step interval.

8. A system for detecting high impedance faults, comprising:

a memory device for storing a program;

a processor in communication with the memory device, the processor operative with the program to:

receive an input waveform from a circuit, wherein the circuit is a power distribution network;

compute a root mean square of the input waveform for each of a plurality of consecutive first time periods;

fit a regression line to the root mean squares;

compute a deviation between the regression line and the root mean squares for each of a plurality of consecutive second time periods;

determine whether the deviations are above a threshold, wherein determining whether the deviations are above the threshold comprises selecting a continuous number of the second time periods for analysis, computing a mean of the deviations within the selected time period and computing a maximum of the deviations within the selected time period minus the mean, wherein the deviations are above the threshold when the mean exceeds a predetermined percentage of the maximum; and output a first value indicating that a high impedance fault has occurred in the circuit when the deviation is above the threshold and a second value indicating that a high impedance fault did not occur in the circuit when the deviation is below the threshold, wherein the input waveform is generated without being triggered by the processor.

9. The system of claim 8, wherein the processor is further operative with the program when computing the root mean squares to:

select a first sliding window having a length equivalent to each of the first time periods; and move the sliding window to a next first time period each time the root ean square for a present first time period is computed.

10. The system of claim 9, wherein the processor is further operative with the program when fitting the regression line to the root mean squares to:

select a second sliding window having a length equivalent to each of the first time periods; and for each position of the second sliding window, fit a linear model to the root mean squares in the second sliding window and compute a value of the linear model at a midpoint of the second sliding window.

11. The system of claim 10, wherein the processor is further operative with the program when computing the deviation to:

for each position of the second sliding window, subtract the value of the linear model from the root mean squares in the second sliding window;

select a third sliding window having a length equivalent to each of the second time periods;

select a step interval that is smaller than the third sliding window;

for each position of the third sliding window:

compute a mean value of the difference between the value of the linear model and the root mean squares; and compute a maximum of the mean value subtracted from the difference;

selecting the threshold; and for each step interval, determine whether the maximum of the mean value subtracted from the difference is greater than the threshold or less than the threshold.

12. The system of claim 8, wherein the values indicating that a high impedance fault has occurred or did not occur are output to a display device.

13. A method for detecting high impedance faults, comprising:

receiving, using a device, an input waveform from a circuit, wherein the circuit is a power distribution network;

computing, using the device, an average of voltage and current over a plurality of first time periods for the input waveform;

fitting, using the device, a model to the averages;

computing, using the device, a deviation between the model and the averages for each of a plurality of second time periods;

determining, using the device, whether the deviations are above a threshold, wherein determining whether the deviations are above the threshold comprises selecting a continuous number of the second time periods for analysis, computing a mean of the deviations within the selected time period and computing a maximum of the deviations within the selected time period minus the mean, wherein the deviations are above the threshold when the mean exceeds a predetermined percentage of the maximum;

outputting, using the device, results of the determination to a table; and detecting that a high impedance fault has occurred in the circuit when the deviations are above the threshold, wherein machine code is executed by a processor of the device to compute the deviation between the model and the averages for each of the plurality of second time periods.

14. The method of claim 13, further comprising:

triggering, using the device, an alarm when the results indicate that the high impedance fault has occurred in the circuit.

15. The method of claim 13, further comprising:

plotting, using the device, a receiver operating characteristic (ROC) curve of the results;

repeating, using the device, the determining step using a different threshold;

plotting, using the device, an ROC curve of the results obtained with the different threshold; and determining, using the device, an optimal threshold based on the ROC curves.

16. A method for detecting faults, comprising:

receiving, using a device, an electrical signal from a circuit, wherein the circuit is a power distribution network;

preprocessing, using the device, the electrical signal to create a reference sampled over time;

mapping, using the device, the reference to a model, wherein the model is polynomial; and determining, using the device, whether a fault exists in the circuit by analyzing a deviation between the reference and the model, wherein the fault is at least one of a high impedance fault and low impedance fault, wherein the reference includes a table root mean square RMS(t), the table RMS(t) represented mathematically as:

$$\text{RMS}(t) = \frac{1}{W}\sqrt{\sum_{s=0}^{W-1} IW(t*\Delta T + s)^2},$$

wherein IW is a one-dimensional table of numbers representing the electrical signal, the one-dimensional table being indexed by s=0, 1, 2 ... N−1, W represents the length of a sliding window over which the RMS is computed, $\Delta T$ represents the amount in seconds the sliding window is moved each time a normalized RMS value is computed, s represents a running index of samples within the sliding window, and RMS(t) represents the RMS value of IW at time t$\Delta T$, and wherein machine code is executed by a processor of the device to create the reference sampled over time.

17. The method of claim 16, wherein the electrical signal is at least one of a periodic and non-periodic signal.

18. The method of claim 16, wherein the reference is sampled over at least one of two consecutive time periods and two non-consecutive time periods.

* * * * *